United States Patent
Renau et al.

(10) Patent No.: US 9,520,360 B2
(45) Date of Patent: Dec. 13, 2016

(54) ANGLED ION BEAM PROCESSING OF HETEROGENEOUS STRUCTURE

(71) Applicant: Varian Semiconductor Equipment Associates, Inc., Gloucester, MA (US)

(72) Inventors: Anthony Renau, West Newbury, MA (US); Christopher Hatem, Seabrook, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/131,332

(22) Filed: Apr. 18, 2016

(65) Prior Publication Data

US 2016/0233162 A1 Aug. 11, 2016

Related U.S. Application Data

(63) Continuation of application No. 14/615,639, filed on Feb. 6, 2015, now Pat. No. 9,337,040.

(60) Provisional application No. 62/087,980, filed on Dec. 5, 2014.

(51) Int. Cl.

| | |
|---|---|
| H01L 21/266 | (2006.01) |
| H01L 23/528 | (2006.01) |
| H01L 21/265 | (2006.01) |
| H01L 21/3065 | (2006.01) |
| H01L 27/115 | (2006.01) |
| H01L 21/768 | (2006.01) |
| H01L 23/522 | (2006.01) |
| H01L 21/263 | (2006.01) |

(52) U.S. Cl.
CPC ....... *H01L 23/5283* (2013.01); *H01L 21/2633* (2013.01); *H01L 21/26586* (2013.01); *H01L 21/3065* (2013.01); *H01L 21/76816* (2013.01); *H01L 23/5226* (2013.01); *H01L 27/1157* (2013.01); *H01L 27/11524* (2013.01); *H01L 27/11551* (2013.01); *H01L 27/11556* (2013.01); *H01L 27/11578* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 6,306,737 B1 * | 10/2001 | Mehrad | ............ | H01L 21/76895 257/E21.59 |
| 7,091,551 B1 * | 8/2006 | Anderson | .......... | G11C 16/0475 257/324 |

(Continued)

*Primary Examiner* — Thao P Le

(57) ABSTRACT

A method for fabricating a multilayer structure includes providing a mask on a device stack disposed on the substrate, the device stack comprising a first plurality of layers composed of a first layer type and a second layer type; directing first ions along a first direction forming a first non-zero angle of incidence with respect to a normal to a plane of the substrate, wherein a first sidewall is formed having a sidewall angle forming a first non-zero angle of inclination with respect to the normal, the first sidewall comprising a second plurality of layers from at least a portion of the first plurality of layers and composed of the first layer type and second layer type; and etching the second plurality of layers using a first selective etch wherein the first layer type is selectively etched with respect to the second layer type.

18 Claims, 7 Drawing Sheets

(56) References Cited

U.S. PATENT DOCUMENTS

| | | | | |
|---|---|---|---|---|
| 7,352,018 B2* | 4/2008 | Specht | ................... | H01L 21/84 |
| | | | | 257/15 |
| 8,183,627 B2* | 5/2012 | Currie | ............ | H01L 21/823807 |
| | | | | 257/329 |
| 9,171,730 B2* | 10/2015 | Chowdhury | .......... | H01L 21/283 |
| 9,449,987 B1* | 9/2016 | Miyata | .............. | H01L 27/11529 |
| 2010/0133599 A1* | 6/2010 | Chae | ................. | H01L 27/11578 |
| | | | | 257/315 |
| 2011/0108920 A1* | 5/2011 | Basker | ................ | H01L 21/845 |
| | | | | 257/351 |
| 2013/0270627 A1* | 10/2013 | Cheng | ............ | H01L 21/823431 |
| | | | | 257/326 |
| 2014/0054787 A1* | 2/2014 | Eun | .................... | H01L 27/2481 |
| | | | | 257/773 |
| 2015/0076606 A1* | 3/2015 | Cheng | ............. | H01L 29/66795 |
| | | | | 257/365 |
| 2016/0148835 A1* | 5/2016 | Shimabukuro | ... | H01L 21/76802 |
| | | | | 257/314 |

* cited by examiner

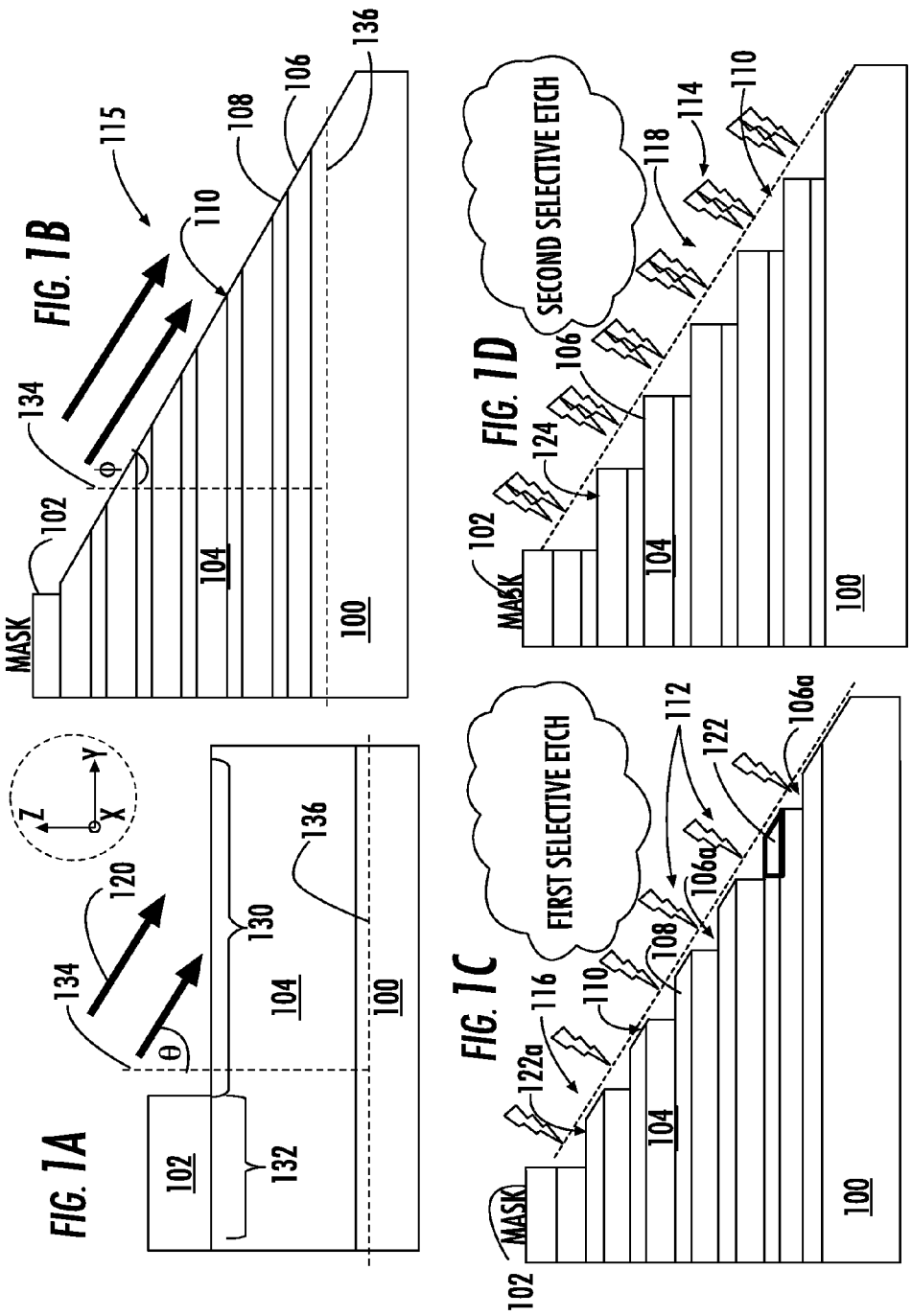

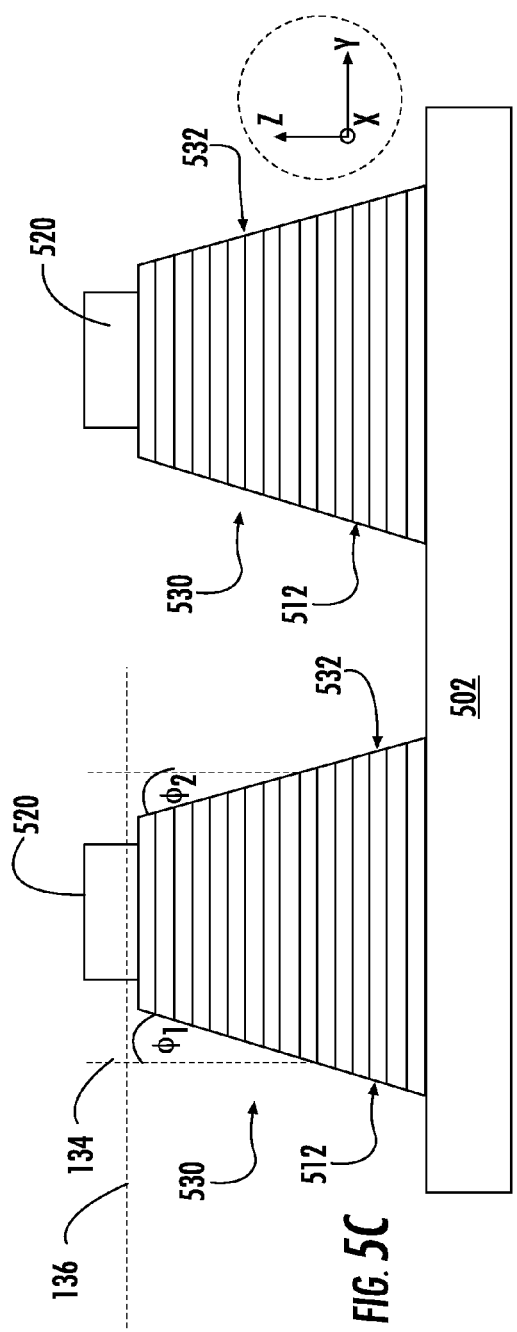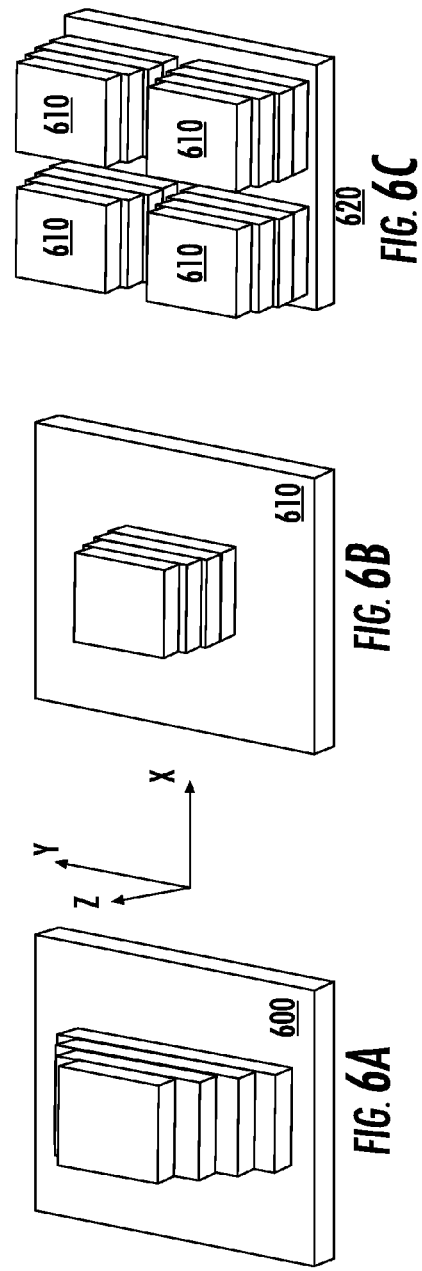

ANGLED ION BEAM PROCESSING OF HETEROGENEOUS STRUCTURE

CROSS-REFERENCE TO RELATED APPLICATIONS

This application claims priority to U.S. provisional patent application No. 62/087,980, entitled "ANGLED ION BEAM PROCESSING OF HETEROGENEOUS STRUCTURE," filed Dec. 5, 2014, and is a continuation of and claims priority to U.S. non-provisional application Ser. No. 14/615,639 filed Feb. 6, 2015, each application being incorporated by reference herein in its entirety.

FIELD

The present embodiments relate to substrate processing, and more particularly, to techniques for fabricating multilayer device structures.

BACKGROUND

As semiconductor devices scale to smaller dimensions, a need has arisen to develop three dimensional structures to provide more device functionality within a given area on a substrate. Examples of these three dimensional structures include finFET logic devices as well as 3 dimensional (3-D) memory devices. One example of 3D memory attracting recent interest is a type of flash memory known as a vertical NAND device or VNAND. In some particular implementations, the VNAND devices are implemented by fabricating 16, 32, or 64 layers to serve as storage elements. In one variant, in order to access different layers the VNAND device stack may be patterned with a masking element, and subsequently etched in a series of cycles through the series of layers contained in the device stack. In a given cycle, the mask size is reduced by resist trimming between successive etch operations to form a pyramidal staircase structure where the top of the pyramid may be the top device layer, and the base of the pyramid constitutes the deepest device layer exposed so contact formation can subsequently be made. This process may entail many cycles including many etch operations, because the etch operation is performed as a vertical reactive ion etching sequence configured to etch just one or a few layers in a cycle. Thus, for a 64 layer device stack, a series of 8, 16, or greater number of etch operations may be performed, as well as a like number of mask trimming operations. In addition, after performing such a large number of etch operations, the shape of such device structures may be compromised, leading to a less reliable process. Moreover, the resist trimming operation may result in reduction in dimension of a mask element along all sides of a square or rectangular resist shape, resulting in a square pyramid device structure occupying a large projected area on the substrate. An overly large structure is produce even in the case when just two sides of the pyramid structure are to be accessed to form a memory device.

It is with respect to these and other considerations the present improvements have been needed.

SUMMARY

This Summary is provided to introduce a selection of concepts in a simplified form further described below in the Detailed Description. This Summary is not intended to identify key features or essential features of the claimed subject matter, nor is it intended as an aid in determining the scope of the claimed subject matter.

In one embodiment, a method for fabricating a multilayer structure on a substrate may include providing a mask on a device stack disposed on the substrate, the device stack comprising a first plurality of layers composed of a first layer type and a second layer type; directing first ions along a first direction forming a first non-zero angle of incidence with respect to a normal to a plane of the substrate, wherein a first sidewall is formed having a sidewall angle forming a first non-zero angle of inclination with respect to the normal, the first sidewall comprising a second plurality of layers from at least a portion of the first plurality of layers and composed of the first layer type and second layer type; and etching the second plurality of layers using a first selective etch wherein the first layer type is selectively etched with respect to the second layer type, wherein a first sidewall structure is formed having a stepped structure and defining a first average sidewall angle having a non-zero angle of inclination with respect to the normal, wherein a stepped surface of the first sidewall structure is angled with respect to the first average sidewall angle.

In another embodiment, a method for fabricating a multilayer structure on a substrate may include providing a mask on a device stack disposed on the substrate, the device stack comprising a first plurality of layers composed of a first layer type and a second layer type; directing first ions along a first direction forming a first non-zero angle of incidence with respect to a normal to a plane of the substrate, wherein a first sidewall is formed having a sidewall angle forming a first non-zero angle of inclination with respect to the normal, the first sidewall comprising a second plurality of layers from at least a portion of the first plurality of layers and composed of the first layer type and second layer type; and forming an electrical contact to at least one layer of the first layer type along the first sidewall.

In a further embodiment, a multilayer device may include a heterogeneous device stack disposed on a substrate, the heterogeneous device stack comprising at least one layer of a first layer type and at least one layer of a second layer type; at least one sidewall defining a first average sidewall angle having a non-zero angle of inclination with respect to a normal to a substrate plane; and at least one additional sidewall defining a second average sidewall angle different from the first average sidewall angle wherein the at least one sidewall comprises a stepped structure.

BRIEF DESCRIPTION OF THE DRAWINGS

FIGS. 1A-1D depict a cross-section of a device structure at various instances illustrating exemplary operations involved in a method for fabricating a multilayer structure according to various embodiments of the disclosure;

FIGS. 5A-5C depict a cross-section of a device structure at various instances illustrating exemplary operations involved in a method for fabricating a multilayer structure according to additional embodiments of the disclosure; and FIGS. 6A-6C depict a perspective view of different device structures according to additional embodiments of the disclosure.

DETAILED DESCRIPTION

Figure 2A:
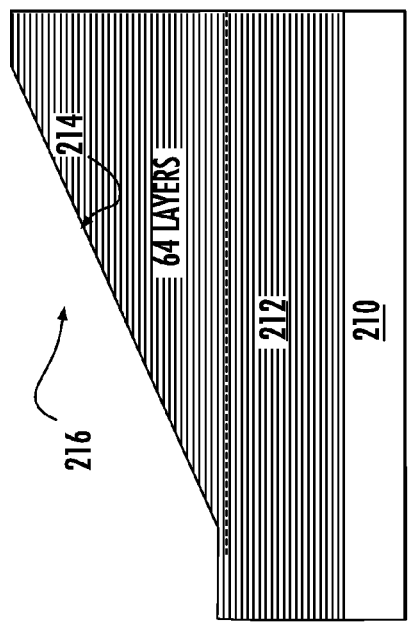
FIGS. 2A-2C depict cross-sectional micrographs of exemplary device structures after processing using an angled ion beam according to embodiments of the disclosure.

The embodiments described herein provide techniques and for fabricating multilayer structures on a substrate composed of multiple layers, where the multiple layers may be referred to herein as a "device stack." The device stack may be a heterogeneous device stack, meaning the device stack includes at least one layer of a first layer type and at least one layer of a second layer type. The first layer type generally differs from the second layer type in composition of material, or microstructure, or composition and microstructure. An example of a heterogeneous device stack may be a stack of layers where a silicon layer and an insulating layer are arranged in alternating fashion. Such an arrangement is characteristic of vertical or 3D device structures such as the aforementioned VNAND. The embodiments are not limited in this context and may include other heterogeneous device stacks.

Various embodiments provide a treatment of a heterogeneous device stack by a novel combination of etching processes defining angled device structures, where the sides of device structures define a non-zero angle with respect to a normal (perpendicular) to a plane of the substrate. Such device structures, by virtue of the non-zero angle, may provide convenient access to a plurality of different layers within the device structure, as detailed below.

In particular embodiments, in one operation directed ion etching is provided to a masked heterogeneous device stack at a non-zero angle with respect to the normal to define an angled device structure having an angled sidewall extending through a plurality of layers of the device stack. In a subsequent operation, a selective etching process or multiple selective etching processes may be performed on the angled device structure in order to define a stepped device structure defining an angle similar to the angled device structure.

Turning now to FIG. 1A there is shown an initial device structure composed of a substrate 100 and device stack 104. The term "substrate" as used herein may refer to a portion of a substrate structure where other materials, layers, and so forth may be disposed. Thus, the substrate 100 of FIG. 1 forms a base structure where other materials, such as the device stack 104 may be disposed upon the base structure. In particular examples disclosed herein, a device structure may be fabricated on a substrate, where the device structure may be located in layers other than the substrate. In other examples, a device structure may be formed partially within a substrate in other examples.

In various embodiments, the device stack 104 is composed of a plurality of layers extending throughout the device stack as shown in more detail in FIG. 1B. In this example, the device stack 104 may be characterized as a heterogeneous device stack including a first layer type alternating with a second layer type, forming a sequence of layers 108 alternating with layers 106, as shown. In a particular example for fabricating a memory structure, the layers 108 may be silicon and the layers 106 may be an insulator material layer such as oxide, or alternatively the stacked layers 108 maybe silicon nitride and layers 106 maybe oxide. The embodiments are not limited in this context. In some examples a layer thickness of either layer, meaning layer 108 or layer 106, may range between 5 nm and 500 nm. The embodiments are not limited in this context. In other embodiments, a heterogeneous device stack may be composed of different sequences of layers, such as a sequence of three different layer types.

According to various embodiments of the disclosure the device stack 104 may be etched in a pattern in order to form a device structure defined by an angled side or angled sides of a device, where the angled sides are composed of a plurality of layers within the device stack 104. The term "angled" as used herein refers to a surface, structure, or trajectory of ions where the relevant feature forms a non-zero angle with respect to a normal to a substrate plane. In order to define such a device structure a mask 102 is disposed on the device stack 104 over a portion of the device stack, leaving an exposed portion 130 of the device stack 104. The mask 102 may be a hard mask, such as an oxide, nitride, carbon, or other material, may be a resist material, or other material known in the art. The mask 102 may be composed of a plurality of mask elements instead of just one mask feature as illustrated in FIG. 1A. In accordance with the Cartesian coordinate system shown, in some embodiments, a mask dimension along the X-axis, Y-axis, or X- and Y-axis may range from 5 nm to 1000 nm. The embodiments are not limited in this context.

In accordance with embodiments of the disclosure, ions may be directed to the device stack 104 to etch portions of the device stack 104 to define a device structure. The mask 102 may serve to block ions from striking protected regions 132 of the device stack 104. Thus, the mask 102 may be designed to have adequate thickness to attenuate ions according to the specie of ion, the ion energy, ion dose, and angle of incidence of ions 120. In the instance shown in FIG. 1A ions 120 are directed to the device stack 104 at a non-zero angle of incidence, shown as the angle $\theta$ with respect to a normal 134 to the plane 136 of the substrate 100, where the angle $\theta$ may vary between 15 degrees and 70 degrees in some embodiments. In various embodiments, the ions 120 may be inert gas ions (He, Ar, Kr, Xe, Rn) configured to etch the device stack 104 by physical sputtering. An advantage of using inert gas ions is providing physical etching of different layers within the device stack 104 so the different layers may not be sensitive to variations in material in the device stack, and unwanted reactions between ions 120 and material within the device stack 104 may be avoided. In some embodiments, the ion energy of ions 120 may be less than 50 KeV, and in particular embodiments may range between 1 keV and 30 KeV. The embodiments are not limited in this context.

According to particular embodiments the ions 120 may be provided by known apparatus including beamline ion implanters, compact ion beam sputtering type apparatus, or other apparatus configured to direct ions to a substrate at a non-zero angle of incidence with respect to a normal to the plane of the substrate. Turning now to the FIG. 1B there is shown a later instance where ions 120 have etched the device stack 104 in the exposed portion 130 so as to define a sidewall, or side 110, of an angled device structure 115 angled with respect to the normal 134. In various embodiments an angle of inclination $\phi$ of the side 110 may be similar to—or the same as the angle of incidence $\theta$ of the ions 120. The ion dose of ions 120 may be varied depending upon the number of layers of the device stack 104 to be etched. For example, the device stack 104 may be composed of a first plurality of layers including, for example, 64 layers, while it is targeted to etch just 32 layers. Accordingly a dose of ions 120 may be provided for etching just half of the device stack 104. In the example of device stack 104, in contrast, the entire device stack 104 has been etched to the substrate 100.

An advantage of using a tool such as a beamline ion implanter to etch the device stack 104 is control of angle of incidence. For example, the angle of incidence θ of ions 120 may be controlled to a precision of better than 1 degree in some instances, allowing for formation of a side 110 having a precisely defined angle of inclination, shown as an angle of inclination φ.

Figure 2B:
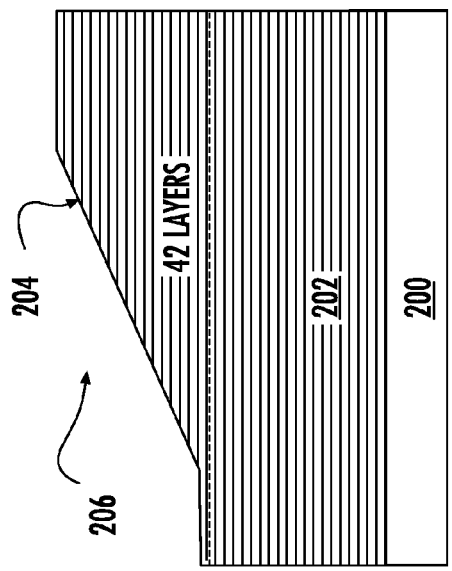

Turning now to FIGS. 2A and 2B there are shown cross-sectional micrographs of exemplary device structures after processing using an angled ion beam according to embodiments of the disclosure. In FIG. 2A a device stack 202 having approximately 90 layers formed by alternating layers of polysilicon and silicon oxide is disposed on a substrate 200. The device stack 202 has been etched using an ion beam at an angle of incidence of approximately 30 degrees with respect to a normal (parallel to the Z-axis) to a surface of the substrate 200. An ion dose has been provided to etch 42 layers of the device stack 202, defining a side 204 of a device structure 206. In FIG. 2B a device stack 212 also having approximately 90 layers formed by alternating layers of polysilicon and silicon oxide is disposed on a substrate 210. The device stack 212 has been etched using an ion beam at an angle of incidence of approximately 30 degrees with respect to a normal (parallel to the Z-axis) while an ion dose has been provided to etch 64 layers of the device stack 212, defining a side 214 of the resultant device structure 216. In the two cases, the respective sides, side 204 and side 214, are smooth and the microstructure exhibits no ripples or significant deformation.

Figure 2C:
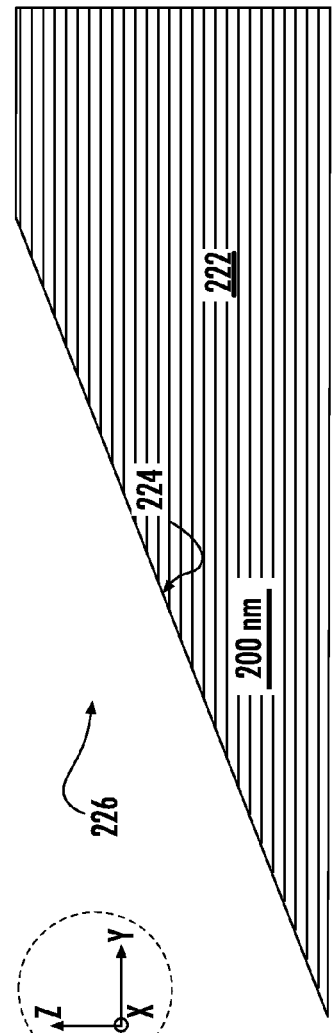

FIG. 2C depicts a close-up view of a portion of a device stack 222 after etching via an angled ion beam at an angle of incidence of approximately 30 degrees with respect to a normal to form the device structure 226. As illustrated, the side 224 exhibits a smooth surface.

Returning now to FIG. 1B, at the instance shown the angled device structure 115 does not have a defined stepped structure. In some embodiments, the non-stepped structure of the angled device structure 115 in FIG. 1B may be adequate for formation of contacts to select layers in the angled device structure 115, such as at least one layer of layers 106.

Returning now to FIG. 1C there is shown a further operation to define a stepped surface in the device structure 206, or angled device structure 115 of FIG. 1B. In particular, the device structure 206 may be subject to a first selective etch configured to direct etching species 112 to the side 110. In various embodiments the etching species 112 may be reactive ion etching species as known in the art. In other embodiments, the etching species 112 may be provided in a selective wet chemical etch as known in the art. The etching species 112 may be designed to selectively etch the layers 106 with respect to the layers 108, meaning a first etch rate of the layers 106 is greater than a second etch rate of the layers 108. After exposure to the etching species 112, portions 106a of layers 106 are removed, resulting in a staircase device structure 116. The staircase device structure 116 is composed of stepped surfaces or terraces 122a forming on portions 122 of layers 108 after the portions 106A are removed.

Figure 3B:
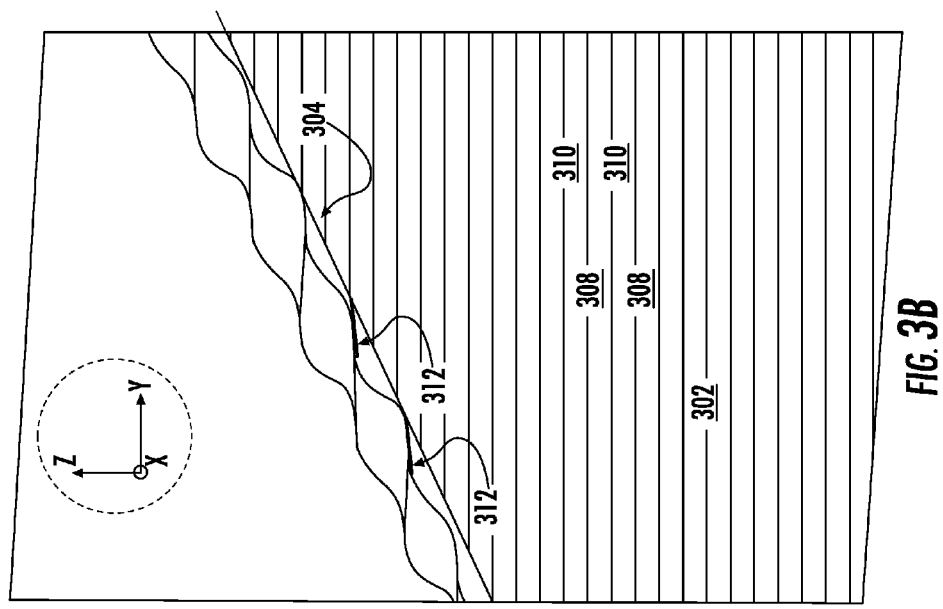
FIG. 3B depicts a close-up view of a portion of the device structure of FIG. 3A.
Figure 3A:
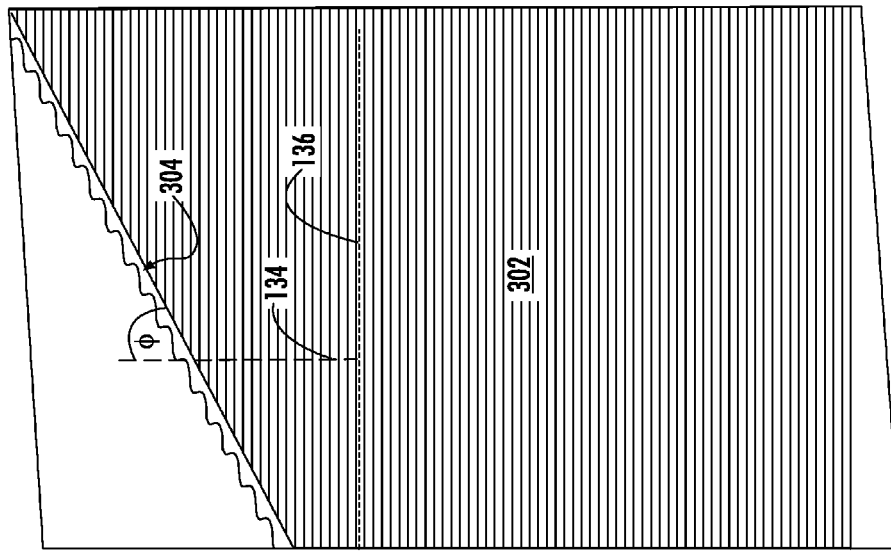
FIG. 3A depicts a cross-sectional micrographs of an exemplary device structure after sequential processing using an angled ion beam and selective etching according to embodiments of the disclosure.

Turning now to FIGS. 3A and 3B, there is shown a cross-sectional micrograph of a staircase device structure 302 fabricated according to embodiments of the disclosure. The staircase device structure 302 includes a plurality of layers 308 of a first type, alternating with a corresponding plurality of layers 310 of a second type. Accordingly, a layer of a first type and a layer of a second type may be deemed one layer pair and the staircase device structure 302 may include a plurality of layer pairs. The structure of the staircase device structure 302 may be formed by directing an angled ion beam at an angle of incidence with respect to the normal 134 to the plane 136, generating a sidewall structure shown as the side 304 having a stepped surface. The side 304 is generally defined by an average sidewall angle having a first angle of inclination φ with respect to the normal 134. The sidewall structure is composed of stepped surfaces, or terraces 312. The terraces 312 are angled with respect to the average sidewall angle, in other words, are oriented at a second angle of inclination different than the first angle of inclination φ. As viewed in FIGS. 3A and 3B the second angle of inclination is more horizontally oriented, in other words, lies closer to parallel with the X-Y plane.

Returning now to FIG. 1D there is shown a further operation involving performing a second selective etch to the staircase device structure 116. In this example the second selective etch directs etching species 114 toward the side 110. In various embodiments the etching species 114 may be reactive ion etching species or wet chemical etching species as known in the art. The etching species 114 may be designed to selectively etch the layers 108 with respect to the layers 106, meaning an etch rate of the layers 108 is greater than an etch rate of the layers 106. Thus, in the operations illustrated in FIGS. 1C and 1D the selectivity of etching species is reversed between the operation illustrated in FIG. 1C on the one hand and the operation illustrated in FIG. 1D. In the example of a device stack where the layers 106 are polysilicon and the layers 108 are silicon oxide, the etching species 112 are designed to selectively etch polysilicon at a faster rate than silicon oxide while the etching species 114 are designed to selectively etch silicon oxide at a faster rate than polysilicon. After exposure to the etching species 114, portions 122 of layers 108 (see FIG. 1C) are removed, resulting in a stepped device structure 118. The stepped device structure 118 is composed of terraces 124 forming on portions 122 of layers 106 after the portions 122 of layers 108 are removed.

The device structure 118 may be appropriate for forming electrical contacts to at least one of the layers 106 in the regions of terraces 124. For example an electrical contact (not shown) may be formed on multiple layers 106 using a terrace 124 to serve as a contact point. Thus, the device structure 118 may serve as the basis for forming a three dimensional "staircase" type memory, such as a VNAND memory, where different memory portions are located within different layers, as known in the art. An advantage afforded by the embodiments depicted in FIGS. 1A to 1D is the ability to fabricate a staircase type device structure having large numbers of "stairs" while avoiding the need to perform a concomitantly large number of lithography operations to define the stairs as is the practice in conventional technology. For example, as generally shown in FIGS. 1A-1D and FIGS. 2A-2C, in some embodiments a staircase type device structure having 64 different layers may be fabricated using just one mask while avoiding performing multiple mask trim operations. This simplified process may largely reduce the cost and complexity of forming 3D device structures having multiple layers.

Figure 4:
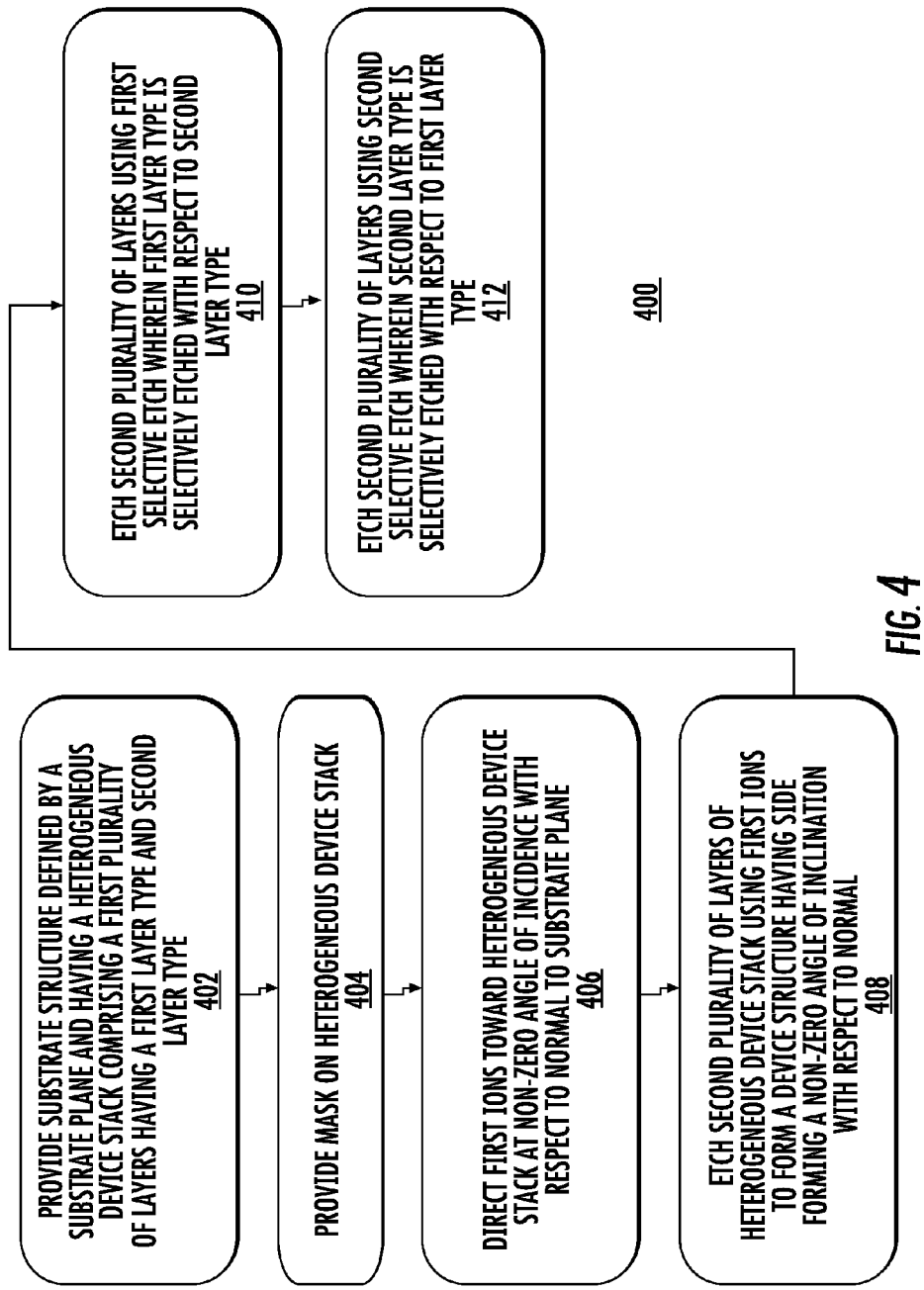
FIG. 4 depicts an exemplary process flow.

FIG. 4 depicts an exemplary process flow 400 comprising exemplary operations involved in a method for forming a device structure according to embodiments of the disclosure. At block 402 a substrate structure is provided, the substrate structure defined by a substrate plane and composed of a heterogeneous device stack including a first plurality of layers having a first layer type and a second layer type.

Layers of the first layer type may be arranged in alternating fashion with layers of the second layer type.

At block 404 a mask is provided on the heterogeneous device stack. The mask may define a plurality of masked regions and a plurality of exposed regions on the surface of the heterogeneous device stack. The mask may be composed of known mask materials including hard mask materials or resist materials.

At block 406 first ions are directed to the device stack at a non-zero angle of incidence with respect to normal to a substrate plane. For example, the layers of the plurality of layers may be arranged to lie parallel to the substrate plane so the non-zero angle of incidence forms a non-zero angle of incidence with respect to a normal to a plane of the layers also. In some embodiments, the first ions may be composed of inert gas ions configured to etch the device stack by physical sputtering.

At block 408 the first ions are used to etch a second plurality of layers of the heterogeneous device stack to form a device structure having a side forming a non-zero angle of inclination with respect to the normal. In some examples, the angle of inclination of the device structure may be equal to the angle of incidence of the first ions. The second plurality of layers may be the same as the first plurality of layers, but may also be composed of fewer layers than the first plurality of layers. In some embodiments, the block 406 and block 408 may constitute part of the same operation of directing first ions toward a heterogeneous device stack.

At block 410 the second plurality of layers is etched using a first selective etch wherein the first layer type is selectively etched with respect to the second layer type. In various embodiments the first selective etch may be a reactive ion etch or alternatively a wet chemical etch. The first selective etch may in particular etch just portions of layers of the first layer type where the layers of the first layer type are exposed along the side of the device stack.

At block 412 the second plurality of layers is etched using a second selective etch wherein the second layer type is selectively etched with respect to the first layer type. In various embodiments the second selective etch may be a reactive ion etch or alternatively a wet chemical etch. The second selective etch may in particular etch just portions of layers of the second layer type where the layers of the first layer type are exposed along the side of the device stack.

In further embodiments a staircase device structure may be fabricated using just one exposure of a device stack to angled ions directed at a non-zero angle of incidence with respect to a normal to a plane of a substrate. The exposure to angled ions may be followed by just one selective etch operation configured to selectively remove material from a first layer type with respect to a second layer type. For example, returning to FIGS. 1A to 1C, in one embodiment, the layers 108 may be polysilicon and layers 106 may be oxide. Accordingly, the operations depicted in FIGS. 1A to 1C may be performed while omitting the second selective etch operation shown in FIG. 1D. In this example, the staircase device structure 116 may be composed of terraces 122a where the terraces 122a are made of polysilicon surfaces to be contacted by an electrically conductive contact (not shown) formed in a subsequent operation. The width of the terraces 122a along a direction parallel to the Y-axis may be less than the width of terraces 124 formed in the process shown in FIG. 1D, but may be adequate for serving as contact structures nonetheless.

Figure 5A:
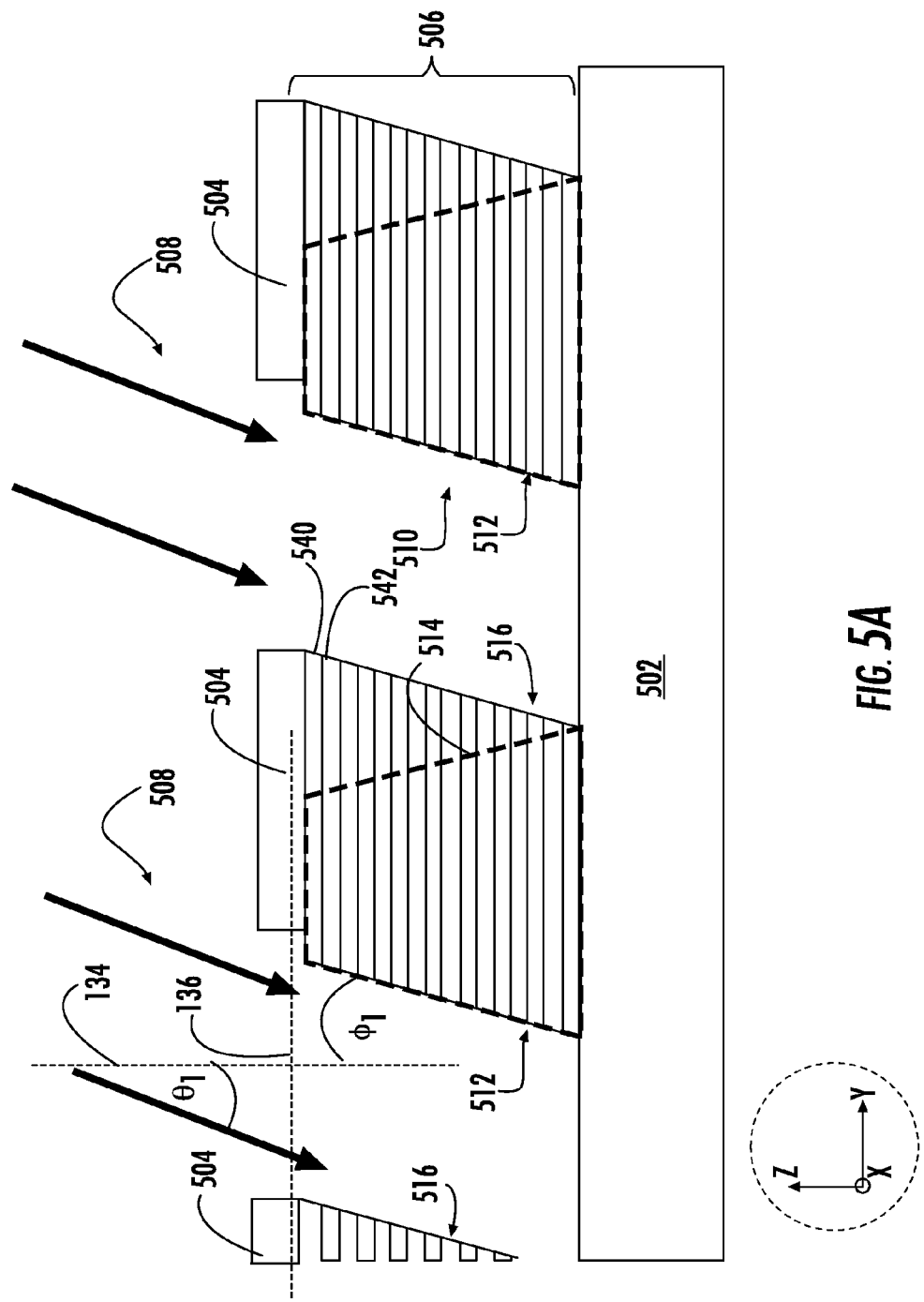
Figure 5B:
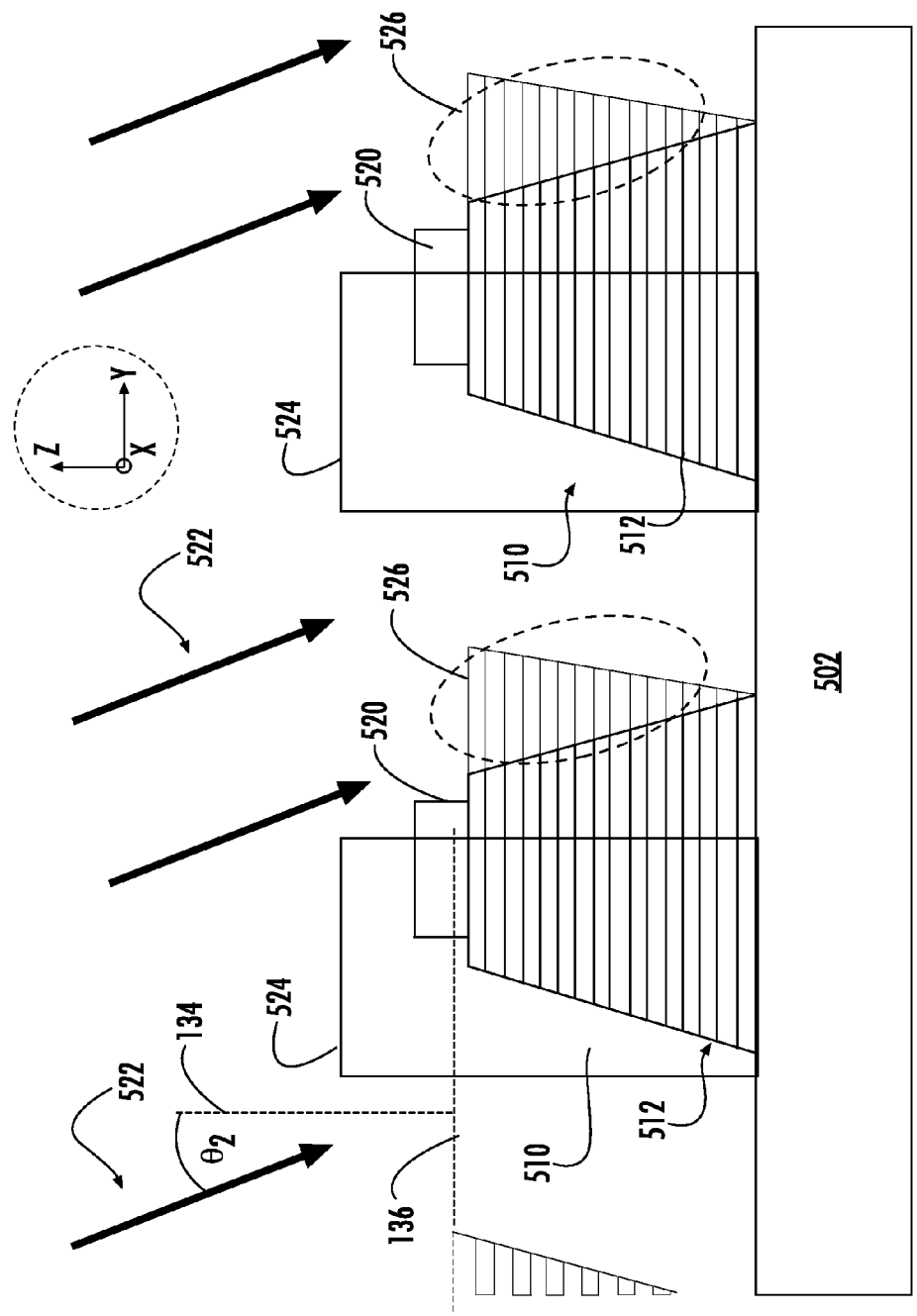

In additional embodiments a multi-layer device structure may be formed on a substrate, where the multi-layer device structure has multiple sides angled with respect to a normal to a plane of the substrate. FIGS. 5A to 5C depict a cross-section of a device structure at various instances, illustrating exemplary operations involved in a method for fabricating a multilayer device structure according to additional embodiments of the disclosure. The sequence of operations may be used, for example, to form a novel VNAND device structure having two sides for forming contacts to different layers of a device. In FIG. 5A there is shown a substrate 502 supporting the device stack 506 is disposed on the substrate 502. The device stack 506 includes a plurality of layers where a first layer type 540 is arranged in alternating fashion with a second layer type 542. The device stack 506 may be exposed to ions 508 when a mask 504 is disposed on a portion of the device stack 506. The ions 508, for example, inert gas ions, are directed at an angle of incidence $\theta_1$ with respect to the normal 134 as generally described above with respect to FIG. 1A. The ions 508 as a result may etch the device stack 506 to form the device structures 510, as illustrated. In particular sides 512 of the device structures 510 may form having an angle of inclination $\phi_1$ with respect to normal 134.

In the example of FIG. 5A, a final target structure 514 for a device to be formed is illustrated in the dashed lines. After the operation illustrated in FIG. 5A, the sides 512 match the structure of the left side of the final target structure 514 to be formed. As is apparent from FIG. 5A, undercut sides 516 are formed on the right sides of device structure extending parallel to the sides 512 due to the etching of the ions 508. In order to accommodate the ability to generate the final target structure 514, the mask 504 extends a greater distance along the Y-axis beyond the dimensions of the top of the final target structure 514.

Turning now to FIG. 5B there is shown a subsequent etching operation, performed by directing ions 522 toward the substrate 502 along a different direction forming an angle of incidence $\theta_2$ with respect to the normal 134. In one example, the angle of incidence $\theta_2$ may, but need not, have the same absolute value as $\theta_1$ with respect to normal 134. In particular embodiments, the angle of incidence and angle of incidence may be symmetrical with respect to a plane defined by the normal 134 parallel to the X-Z plane. In order to etch portions 526 of the device stack 506, the mask 504 may be etched back using known trim processes in order to form the mask 520, configured to expose the portions 526. In addition, a second mask, mask 524, may be provided to mask the sides 512 in order to prevent etching by the ions 522. The mask 524 may be a resist mask in some embodiments or may be a hard mask. The ions 522 may then etch the device stack 506 in exposed regions, meaning portions 526, as shown in FIG. 5b.

Turning now to FIG. 5C, there is shown a device structure 530 formed after etching by the ions 522 is complete. In this example, the device structure 530 includes sides 512 having an angle of inclination $\phi_1$ with respect to the normal 134 and sides 532 having an angle of inclination $\theta_2$ with respect to the normal 134. Subsequently, selective etching of the device structure 530 may be performed as described with respect to FIGS. 1C and 1D, for example, resulting in a staircase device structure suitable for forming contacts to different "stairs" of the staircase.

In summary, the present embodiments provide novel techniques for forming devices structures on a substrate such as multilayer devices where at least one side is to form a non-zero angle with respect to a normal to a plane of the substrate. Various embodiments provide the ability to form a staircase type of device structure suitable for use as a vertical memory such as VNAND, where 32, 64, or a greater number of stairs may be fabricated using just one mask operation and directed ions to form an angled side of the device structure extending through the targeted number of layers.

The present embodiments also provide the ability to tailor the angle of inclination of a side or sides of a device structure by careful control of an ion beam, including a parallel beam of ions at any targeted angle of incidence. For example, staircase device structures having an angle of inclination as small as 15 degrees with respect to normal may be easily fabricated according to the present embodiments. This device structure contrasts with known technology, where a staircase type structure having an angle of inclination is approximately 60 degrees may be generated, for example. An advantage of providing steeper device sides (smaller angle of inclination) is the ability to pack devices closer together within a given footprint defined in the X-Y plane of a substrate.

A further advantage afforded by the present embodiments is the ability to form angled sides of a multilayer device structure on just those sides of the device structure needed for providing access to the different layers of the multilayer device. For example, in known staircase type device structures for use in VNAND, a pyramidal structure is formed having four angled sides as an inevitable byproduct of the multi-operation processing where multiple mask trim operations are performed. Formation of four angled sides is the case even given when contacts may be formed on just two opposing sides of the pyramidal device structure. As exemplified in FIGS. 1A to 1D and 5A to 5C for example, the present embodiments provide a device structure where just one or two sides may be angled, while the other sides may be vertical in principle. This structure allows for further compactness in arrangement of neighboring device structures since device structures may be more closely packed along a direction perpendicular to the vertical sidewalls (such as the X-axis in the FIGs).

More generally, in accordance with the present embodiments, a multilayer device may include a heterogeneous device stack disposed on a substrate, where the heterogeneous device stack includes at least one layer of a first layer type and at least one layer of a second layer type. The multilayer device further may have at least one sidewall defining a first average sidewall angle having a non-zero angle of inclination with respect to a normal to a substrate plane, and at least one additional sidewall defining a second average sidewall angle different from the first average sidewall angle. In some examples, the multilayer device may be formed so the second average sidewall angle is parallel to the normal. Thus, the multilayer device may have at least one "vertical" sidewall and at least one angled sidewall having a stepped structure for use for contacting a layer or layers of the multilayer device.

FIGS. 6A to 6C depict further device structures highlighting some of the aforementioned advantages. In FIG. 6A there is shown a device structure 600 showing a staircase type device having angles sides on two opposing sides of the device structure 600. In FIG. 6B there is shown a device structure 610 showing a staircase type device having angles sides on two opposing sides of the device structure 610. In this example the angle of inclination is arranged to generate steep sides of the device structure 610. In FIG. 6C there is shown an example of a two dimensional array 620 of the device structure 610, showing the ability to achieve a close packing of adjacent device structures.

Moreover, an angle of inclination may be varied between different sides of a device structure by varying the angle of incidence for ions used to treat the different sides. In addition, the present embodiments cover device structures, such as staircase devices, where a different number of layers may be exposed on a first side staircase as opposed to a second staircase.

In an additional embodiment a method of forming a staircase device may include providing a mask on a device stack disposed on the substrate, the device stack comprising a first plurality of layers composed of a first layer type and a second layer type. The method may also include directing first ions along a first direction forming a first non-zero angle of incidence with respect to a normal to a plane of the substrate, wherein a first sidewall is formed having a sidewall angle forming a first non-zero angle of inclination with respect to the normal. The first sidewall may comprise a second plurality of layers from at least a portion of the first plurality of layers and composed of the first layer type and second layer type. The method may also include selectively etching the first layer type with respect to the second layer type, wherein a first sidewall structure is formed having a stepped structure comprising a stepped surface of at least one layer of the second layer type. Additionally, the method may include forming an electrical contact to the at least one layer on the stepped surface.

Finally, the present embodiments cover techniques used to form any multilayer device structure having angled sidewalls beyond the applications of the present embodiments highlighted herein with respect to VNAND.

In some the present embodiments provide multiple advantages over known fabrication techniques for fabricating vertical or 3D device structures, where multiple successive mask treatments may be applied in order to define an angled device structure. For one, the complexity of operations may be advantageously reduced by eliminating the aforementioned multiple mask treatments. For another, total cost of processing may be advantageously reduced by reducing tool use and materials use.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:
1. A semiconductor device, comprising:
a heterogeneous device stack disposed on a substrate, the heterogeneous device stack comprising a first layer type and a second layer type;
a first sidewall, the first sidewall comprising the first layer type and second layer type and defining a first average sidewall angle having a non-zero angle of inclination with respect to a normal to a plane defined by the substrate; and a second sidewall, the second sidewall comprising the first layer type and second layer type and defining a second average sidewall angle different from the first average sidewall angle, wherein the first sidewall comprises a stepped structure.

2. The multilayer device of claim 1, wherein the second average sidewall angle is parallel to the normal.

3. The multilayer device of claim 1, wherein the heterogeneous device stack comprises a vertical NAND memory device (VNAND).

4. A multilayer semiconductor device, comprising:
a heterogeneous device stack disposed on a substrate, the heterogeneous device stack comprising a first layer of a first layer type and a second layer of a second layer type, the heterogeneous device stack comprising four sides;
wherein a first side of the four sides comprises a plurality of stepped surfaces, the plurality of stepped surfaces formed from the first layer and the second layer and defining a first average sidewall angle having a non-zero angle of inclination with respect to a normal to a plane defined by the substrate; and
wherein a second side of the four sides extends along the normal to the plane defined by the substrate.

5. The multilayer device of claim 4, wherein the heterogeneous device stack comprises a vertical NAND memory device (VNAND) having a first plurality of layers of the first layer type and a second plurality of layers of the second layer type to serve as storage elements.

6. The multilayer semiconductor device of claim 4, wherein:
a third side and a fourth side of the four sides extend along the normal to the plane defined by the substrate.

7. The multilayer semiconductor device of claim 4, wherein:
a third side defines a second average sidewall angle different from the first average sidewall angle, the third side not extending along the normal.

8. The multilayer semiconductor device of claim 4, wherein the first average sidewall angle defines a non-zero angle of inclination with respect to the normal of less than sixty degrees.

9. The multilayer semiconductor device of claim 8, wherein the first average sidewall angle defines a non-zero angle of inclination with respect to the normal of fifteen degrees to thirty degrees.

10. The multilayer device of claim 4, wherein the heterogeneous device stack comprises:
a third side of the four sides having a plurality of stepped surfaces and defining the first average sidewall angle; and
a fourth side of the four sides extending along the normal.

11. The multilayer device of claim 10, further comprising a plurality of additional heterogeneous device stacks, the plurality of additional heterogeneous devices stacks comprising four side sides and further comprising:
a first layer of the first layer type and second layer of the second layer type;
first two sides side of the four sides having a plurality of stepped surfaces and defining the first average sidewall angle; and two additional sides of the four sides extending along the normal to the substrate plane,
wherein the two additional sides of a heterogeneous device stack of the plurality of additional heterogeneous device stacks extend parallel to the second side and fourth side of the heterogeneous device stack.

12. A multilayer semiconductor device, comprising:
a heterogeneous device stack disposed on a substrate, the heterogeneous device stack comprising a plurality of layers of a first layer type and a plurality of layers of a second layer type arranged in alternating fashion, the heterogeneous device stack comprising four sides;
wherein a first side of the four sides has a plurality of stepped surfaces and defines a first average sidewall angle, the first average sidewall angle defining a non-zero angle of inclination with respect to a normal to a plane defined by the substrate, and wherein the non-zero angle of inclination is less than 60 degrees.

13. The multilayer semiconductor device of claim 12, wherein:
the first side and a second side of the four sides have a plurality of stepped surfaces and define the first average sidewall angle having a non-zero angle of inclination with respect to the normal to a substrate plane; and wherein
a third side and a fourth side of the four sides extend along the normal.

14. The multilayer semiconductor device of claim 12, wherein:
the four sides have a plurality of stepped surfaces and define the non-zero angle of inclination with respect to the normal.

15. The multilayer semiconductor device of claim 12, wherein
a second side of the four sides comprises a plurality of stepped surfaces defining the first average sidewall angle; and wherein
a third side and a fourth side of the four sides define a second average sidewall angle, the second average sidewall angle differing from the first average sidewall angle, the third side and a fourth side not extending along the normal.

16. The multilayer semiconductor device of claim 12, further comprising a plurality of additional heterogeneous device stacks, the plurality of additional heterogeneous devices stacks having four sides and further comprising:
a plurality of layers of the first layer type and a plurality of layers of the second layer type, wherein a first side of the fours sides has a plurality of stepped surfaces and defines the first average sidewall angle.

17. The multilayer semiconductor device of claim 12, wherein the first layer type comprises silicon and the second layer type comprises an insulator.

18. The multilayer semiconductor device of claim 12, further comprising a first electrical contact formed on a first layer of the first layer type and a second electrical contact formed on a second layer of the first layer type, the second layer being spaced from the first layer by one layer of the second layer type.

* * * * *